US009240812B2

(12) United States Patent
Kumagawa et al.

(10) Patent No.: US 9,240,812 B2
(45) Date of Patent: Jan. 19, 2016

(54) POWER AMPLIFICATION DEVICE AND TRANSMITTER

(71) Applicant: Panasonic Corporation, Osaka (JP)

(72) Inventors: Masahiro Kumagawa, Hyogo (JP);
Akinori Daimo, Hyogo (JP); Hisashi Adachi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/626,712

(22) Filed: Feb. 19, 2015

(65) Prior Publication Data

US 2015/0244324 A1    Aug. 27, 2015

(30) Foreign Application Priority Data

Feb. 26, 2014    (JP) ................................. 2014-035474

(51) Int. Cl.
| H04B 1/02 | (2006.01) |
| H03F 3/217 | (2006.01) |
| H03F 3/21 | (2006.01) |
| H03F 3/24 | (2006.01) |
| H04B 1/04 | (2006.01) |

(52) U.S. Cl.
CPC .................. *H04B 1/02* (2013.01); *H03F 3/211* (2013.01); *H03F 3/2178* (2013.01); *H03F 3/24* (2013.01); *H03F 2200/451* (2013.01); *H03F 2203/21109* (2013.01); *H04B 2001/0408* (2013.01)

(58) Field of Classification Search
CPC .......... H03F 2203/21109; H03F 3/005; H03F 3/2178; H04B 1/02; H04B 2001/0408
USPC ................................... 375/295–297
See application file for complete search history.

(56) References Cited

U.S. PATENT DOCUMENTS

| 2012/0212357 A1 | 8/2012 | Haneda et al. |
| 2012/0236963 A1* | 9/2012 | Ou ........................ H03F 1/0277 375/295 |

FOREIGN PATENT DOCUMENTS

JP    2012-175440    9/2012

OTHER PUBLICATIONS

Sang-Min Yoo et al. "A Switched-Capacitor RF Power Amplifier" IEEE Journal of Solid-State Circuits, vol. 46, No. 12, Dec. 2011, pp. 2977-2987.

* cited by examiner

*Primary Examiner* — Vineeta Panwalkar
(74) *Attorney, Agent, or Firm* — Greenblum & Bernstein, P.L.C.

(57) ABSTRACT

A power amplification device includes: a first power-amplifier array including a plurality of first switching elements that constitute a class-D power amplifier for a higher bits; a second power-amplifier array including a plurality of second switching elements that constitute a class-D power amplifier for a lower bits; and a capacitor array including a plurality of capacitance elements. The second switching elements have a larger on-resistance than the first switching elements. The first power-amplifier array is arranged between the second power-amplifier array and the capacitor array.

12 Claims, 12 Drawing Sheets

FIG. 8
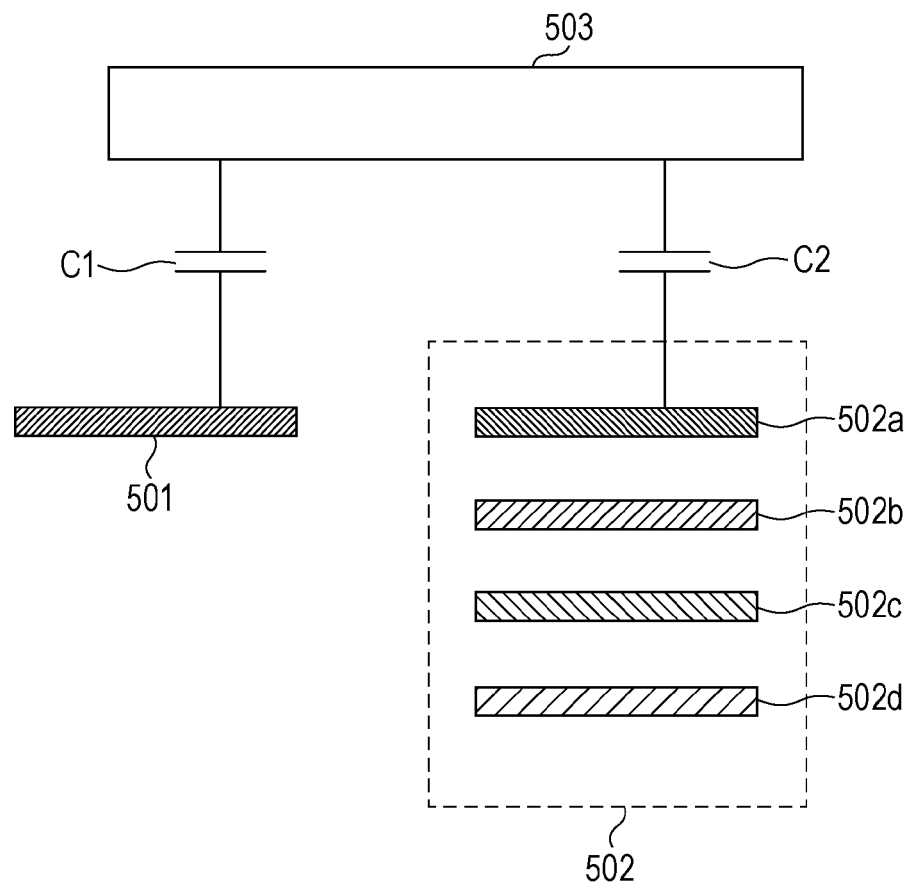
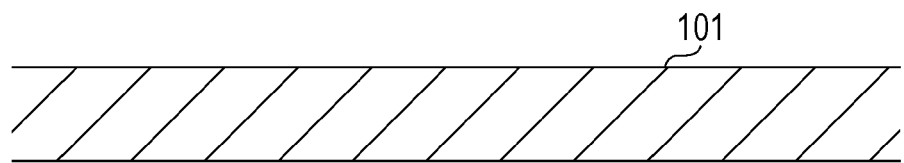

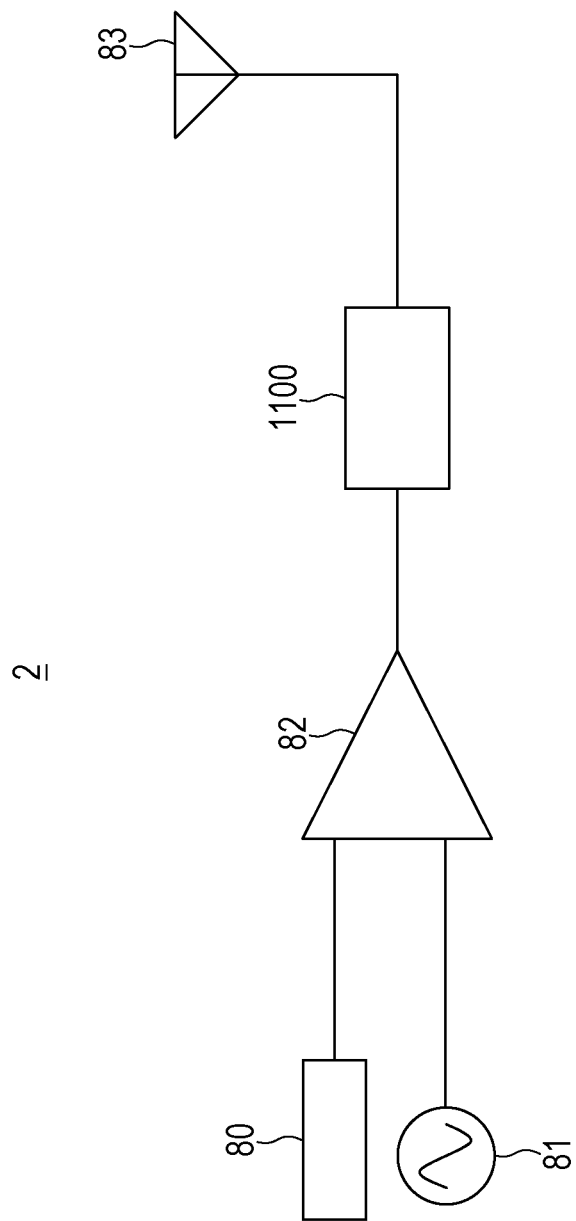

POWER AMPLIFICATION DEVICE AND TRANSMITTER

CROSS REFERENCES TO RELATED APPLICATIONS

This application claims priority to Japanese Patent Application No. 2014-035474, filed on Feb. 26, 2014, the contents of which are hereby incorporated by reference.

BACKGROUND

1. Technical Field

The present disclosure relates to a power amplification device and a transmitter that use a plurality of class-D power amplifiers to amplify transmission signals.

2. Description of the Related Art

Typically, power amplification devices provided in transmitters used for wireless communication amplify very weak amplitudes of input signals and output the resulting signals in order to obtain signal output strengths necessary for wireless systems. Since the very weak amplitudes of input signals are amplified to obtain signals with large output power, power consumed in wireless blocks in the power amplification devices is large. The power consumption has a large influence on, particularly, the drive times of battery-powered wireless devices, such as mobile phones. Accordingly, the power amplification devices require high power efficiencies.

One possible means for enhancing the power efficiencies is using class-D power amplifiers. Class-D power amplifiers utilize saturation operations of transistors, and ideally, electrical current flows only in a switching period, and no unwanted electrical current flows, thus making it possible to obtain high power efficiencies.

In recent years, an orthogonal frequency-division multiplexing (hereinafter "OFDM") system used for wireless local area networks (LANs) is used as a modulation system in order to enhance the spectral efficiency. The OFDM system is a system in which carrier waves having different frequencies are modulated and multiplexed, and the carrier waves are orthogonal to each other. The OFDM system has a high power peak relative to an average power at a timing when the phases of carrier waves overlap each other. The ratio of a peak power to an average power is represented by a peak-to-average power ratio (hereafter "PAPR") and may be about 10 dB in the OFDM system. In the OFDM system, the PAPR is large in principle, and a linear amplifier is required in order to suppress an influence of, for example, inter-symbol interference caused by distortion. When the peak power is set to the saturation power of a power amplifier, the average power takes a small value relative to the saturation power. In this case, since the power amplifier cannot be operated at an operating point at which the power efficiency is high, the power efficiency during output of the average power decreases. Herein, the difference between the maximum power and the average power is referred to as an "amount of back-off". The power amplifier operates at an operating point at which the power efficiency is lower, as the amount of back-off increases.

One possible means for overcoming such a problem is using a switched-capacitor power amplifier. In a switched-capacitor power amplifier, the number of, among a plurality of small-size amplifier cells, amplifier cells that are to operate is controlled using a digital code, thus making it possible to linearly control an output voltage of the switched-capacitor power amplifier. Such a switched-capacitor power amplifier is described in "A Switched-capacitor RF Power Amplifier Solid-State Circuits, IEEE Journal of Volume 46, Issue 12 pp. 2977-2987, December 2011". Switched-capacitor power amplifiers can be said to be radio-frequency digital-to-analog converters (RF-DACs) that output high-frequency signals having amplitudes controlled with digital codes, and have a problem in obtaining favorable linearity. In the following description, the digital codes with which the amplitudes are controlled are referred to as "AM codes".

One means for overcoming such a problem with the switched-capacitor power amplifiers is a digital-to-analog (D/A) conversion circuit disclosed in Japanese Unexamined Patent Application Publication No. 2012-175440. The D/A conversion circuit disclosed in Japanese Unexamined Patent Application Publication No. 2012-175440 ensures linearity by dynamically varying capacitance assignment to individual bits in input data.

In the switched-capacitor power amplifiers of the related art, however, even when the accuracy of capacitance values is adjusted, as in Japanese Unexamined Patent Application Publication No. 2012-175440, there is a problem in that the linearity cannot be sufficiently improved, since the accuracy of resistance values is not adjusted. In particular, in circuits of switched-capacitor power amplifiers, it is necessary to pass large electrical current in order to output signals with large power. When large electrical current is passed through a wire that provides connection between elements, an influence of a voltage drop in the wire increases, which causes a problem of linearity deterioration due to the accuracy factor of a resistance value.

SUMMARY

One non-limiting and exemplary embodiment provides a power amplification device and a transmitter that can obtain favorable linearity by performing circuit layout while considering the resistances of wires that provide connections between elements.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a power amplification device that includes: a first power-amplifier array including a plurality of first switching elements that constitute a class-D power amplifier for a higher bits; a second power-amplifier array including a plurality of second switching elements that constitute a class-D power amplifier for lower bits, the plurality of second switching elements having a larger on-resistance than the first switching elements; and a capacitor array including a plurality of capacitance elements that include a plurality of first capacitance elements that are connected to the plurality of first switching elements and are driven when the plurality of first switching elements are turned on and a plurality of second capacitance elements that are connected to the plurality of second switching elements and are driven when the plurality of second switching elements are turned on. The first power-amplifier array is arranged between the second power-amplifier array and the capacitor array.

A transmitter according to one aspect of the present disclosure has the above-described power amplification device and an antenna that transmits a transmission signal amplified by the power amplification device.

According to the present disclosure, it is possible to obtain favorable linearity by performing circuit layout while considering the resistances of wires that provide connections between elements.

These general and specific aspects may be implemented using a system, a method, and a computer program, and any combination of systems, methods, and computer programs.

BRIEF DESCRIPTION OF THE DRAWINGS

FIG. 8 is a cross-sectional view of a power amplification device according to a fifth embodiment of the present disclosure, the cross-sectional view corresponding to a view taken along line A-A in FIG. 6;

FIG. 12 is a block diagram illustrating the configuration of a transmitter according to an eighth embodiment of the present disclosure.

DETAILED DESCRIPTION

Figure 1:
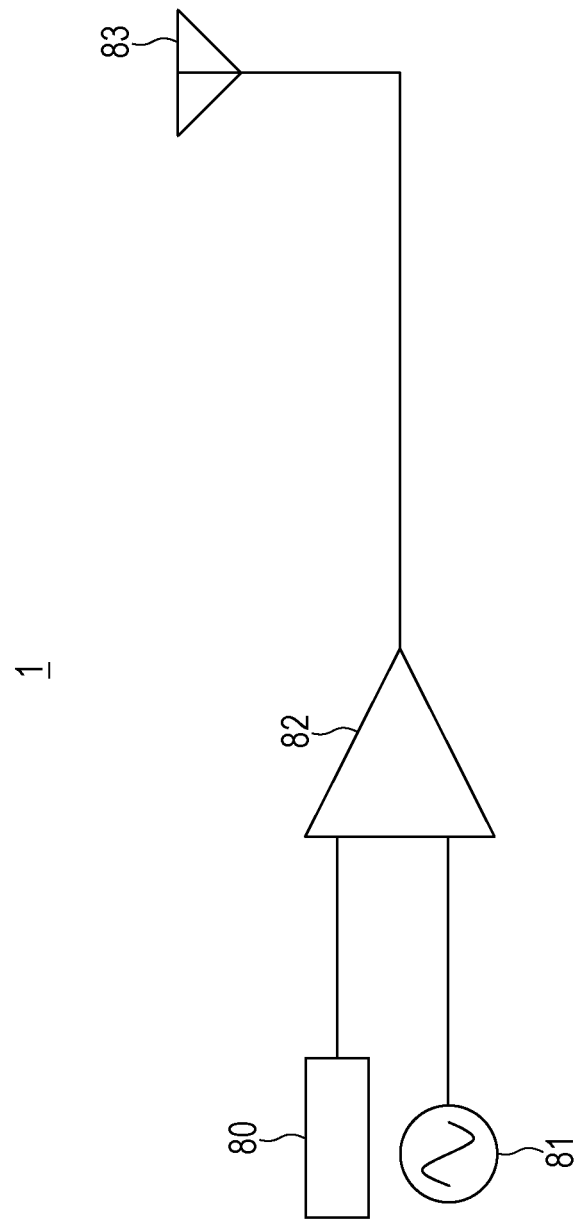
FIG. 1 is a block diagram illustrating the configuration of a transmitter according to a first embodiment of the present disclosure.

A power amplification device and a transmitter according to embodiments of the present disclosure will be described below in detail with reference to the accompanying drawings, as appropriate.

(First Embodiment)
<Configuration of Transmitter>

The configuration of a transmitter 1 according to a first embodiment of the present disclosure will be described below in detail with reference to FIG. 1.

The transmitter 1 generally includes a baseband unit 80, an oscillator 81, a power amplification device 82, and an antenna 83.

The baseband unit 80 generates AM codes and outputs the generated AM codes to the power amplification device 82.

The oscillator 81 generates carrier wave signals and outputs the generated carrier wave signals to the power amplification device 82. Typically, the oscillator 81 is a portion of a phase-locked loop.

In accordance with the AM codes input from the baseband unit 80, the power amplification device 82 operates to amplify the carrier wave signals input from the oscillator 81 and outputs the resulting carrier wave signals to the antenna 83.

The antenna 83 transmits the carrier wave signals, input from the power amplification device 82, by using a wireless channel.

<Configuration of Power Amplification Device>

Figure 2:
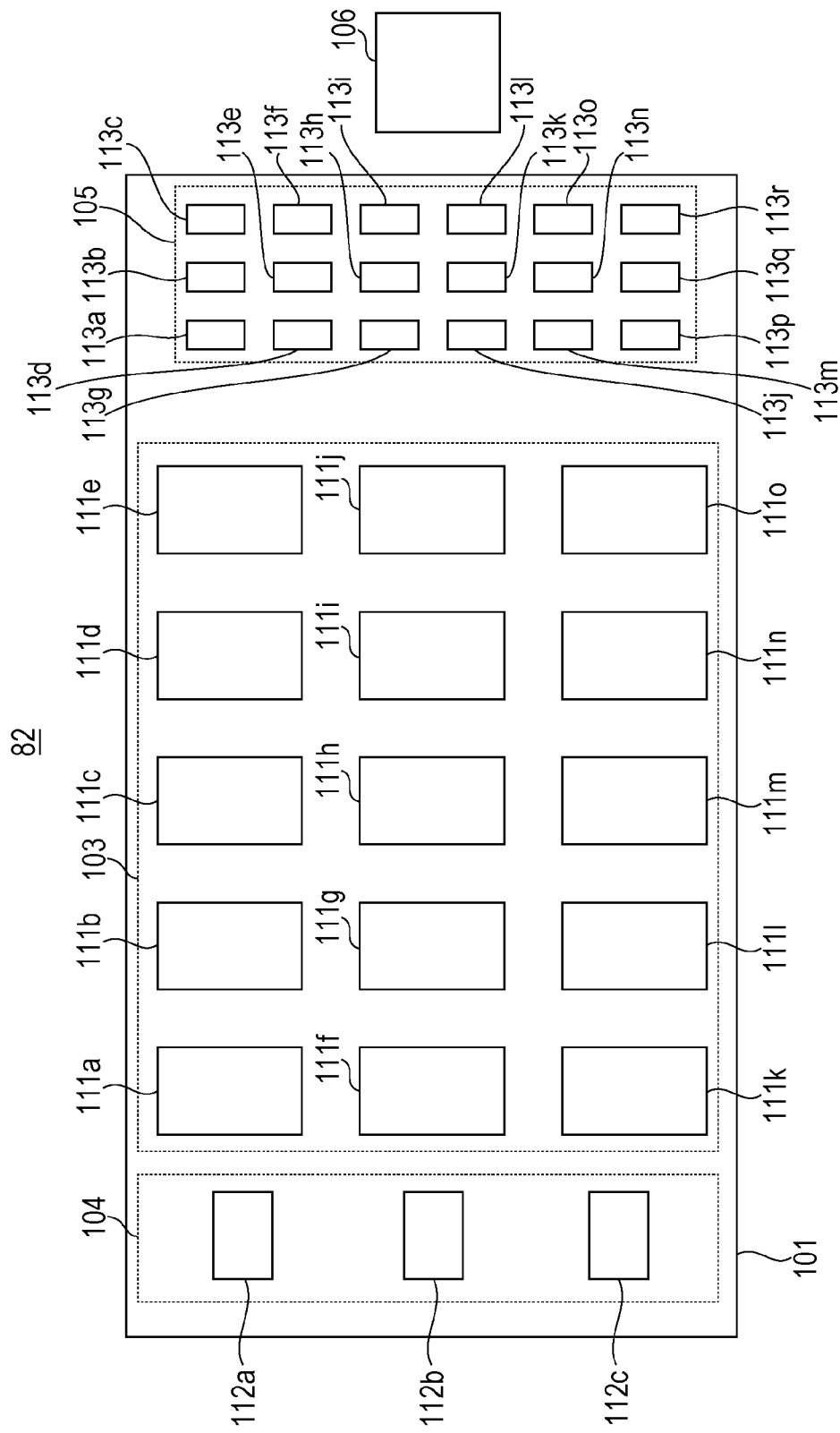
FIG. 2 is a plan view of a power amplification device according to the first embodiment of the present disclosure.
Figure 3:
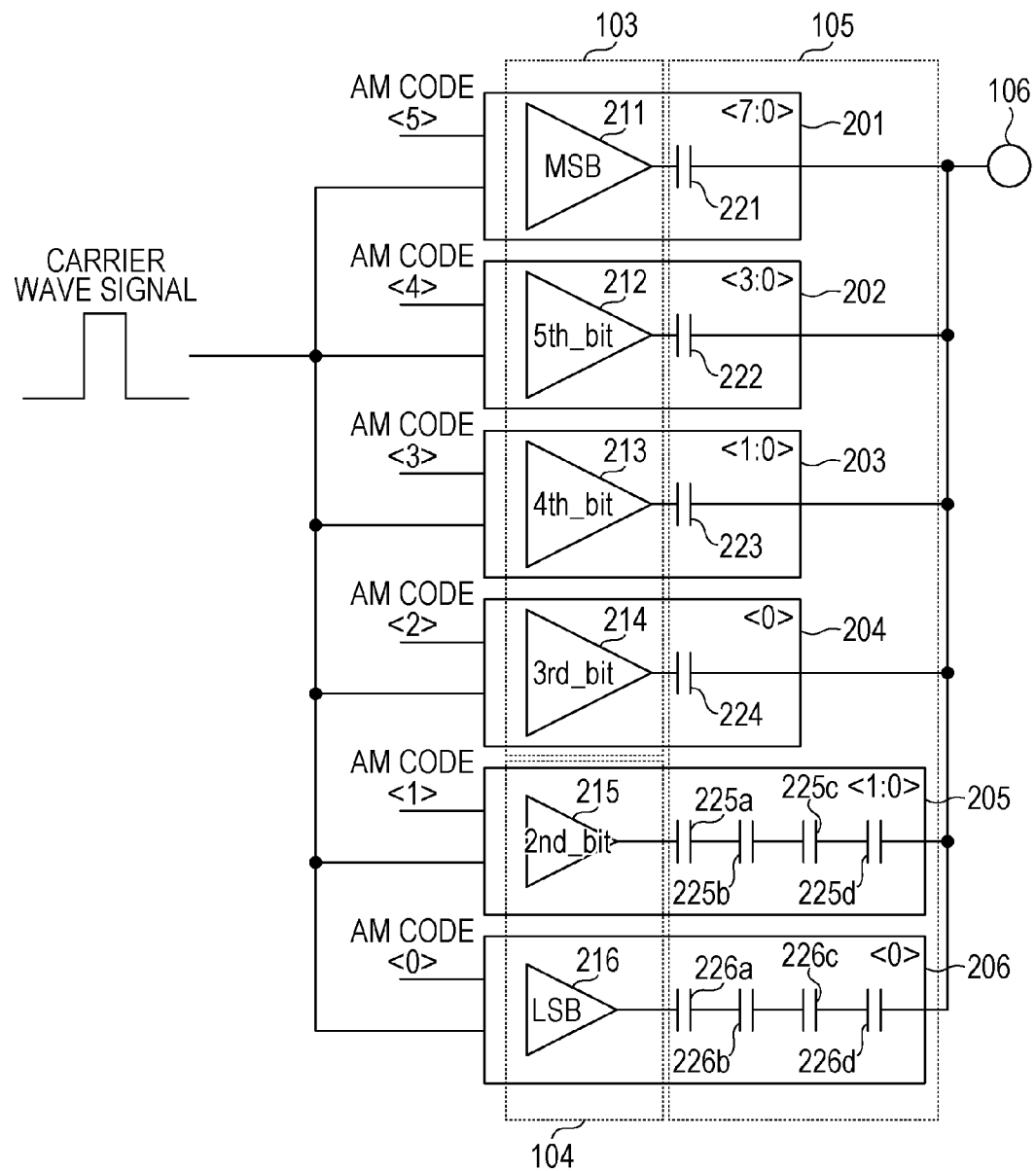
FIG. 3 is a block diagram illustrating the configuration of the power amplification device according to the first embodiment of the present disclosure.

The configuration of the power amplification device 82 according to the first embodiment of the present disclosure will be described below in detail with reference to FIGS. 2 and 3. Each numeral in the brackets < > subsequent to character "AM CODE" in FIG. 3 represents the number of bits of the corresponding AM code. In FIG. 2, portions that are the same as or similar to the corresponding portions in FIG. 1 are denoted by the same reference numerals, and descriptions thereof are not given hereinafter.

The power amplification device 82 generally includes a substrate 101, a first power-amplifier array 103, a second power-amplifier array 104, a capacitor array 105, and an output terminal 106. The substrate 101 is aimed for use in a complementary metal-oxide semiconductor (CMOS) process.

The substrate 101 has the first power-amplifier array 103, the second power-amplifier array 104, and the capacitor array 105.

The first power-amplifier array 103 has a plurality of first switching elements 111a to 111o.

The first switching elements 111a to 111o constitute class-D power amplifiers (described below) for higher bits. The first switching elements 111a to 111o each have a rectangular shape in plan view and are arranged on the substrate 101 so as to have a quadrangular shape in plan view. More specifically, the first switching elements 111a to 111o are arranged in an array of five columns and three rows. Although not illustrated, the first switching elements 111a to 111o are connected to capacitance elements 113a to 113o of the capacitor array 105 on a one-to-one basis. All of the first switching elements 111a to 111o have substantially the same size. The first switching elements 111a to 111o are, for example, output transistors.

The second power-amplifier array 104 has a plurality of second switching elements 112a to 112c. The second power-amplifier array 104 is arranged at a position further away from the capacitor array 105 than the first power-amplifier array 103.

The second switching elements 112a to 112c have a larger on-resistance than the on-resistance of the first switching elements 111a to 111o. The second switching elements 112a to 112c each have a rectangular shape in plan view and are arranged on the substrate 101 so as to be aligned in a line in plan view. More specifically, the second switching elements 112a to 112c are arranged so as to be in an array of one column and three rows. Although not illustrated, the second switching elements 112a to 112c are connected to capacitance elements, included in capacitance elements 113p to 113r and not connected to the first switching elements 111a to 111o, on a one-to-one basis. All of the second switching elements 112a to 112c have substantially the same size. The second switching elements 112a to 112c are, for example, output transistors.

The capacitor array 105 has the capacitance elements 113a to 113r. It is desirable that the capacitor array 105 be arranged closer to the output terminal 106 within a possible range.

The capacitance elements 113a to 113r each have a rectangular shape in plan view and are arranged on the substrate 101 so as to have a quadrangular shape in plan view. More specifically, the capacitance elements 113a to 113r are arranged in an array of three columns and six rows. All of the capacitance elements 113a to 113r have substantially the same size. The capacitance elements 113a to 113r are, for example, metal-oxide-metal (MOM) capacitors.

The capacitance elements 113a to 113o are connected to the first switching elements 111a to 111o on a one-to-one basis and are driven when the first switching elements 111a to 111o are turned on.

The capacitance elements 113p to 113r are connected to the second switching elements 112a to 112c on a one-to-one basis and are driven when the second switching elements 112a to 112c are turned on.

The output terminal 106 provides connections between the capacitance elements 113a to 113r and the antenna 83 (illustrated in FIG. 1).

Next, the configuration of the power amplification device 82 will be described in more detail with reference to FIG. 3.

The x having a binary configuration, as illustrated in FIG. 3.

This power amplification device 82 is constituted by units 201 to 206 for a total of 6 bits including lower two bits and higher four bits.

The units 201 to 206 have class-D power amplifiers 211 to 216 and capacitors 221 to 224, 225a to 225d, and 226a to 226d.

The unit 201 for the most significant bit (MSB), which is the highest-order bit, has one class-D power amplifier 211 and one capacitance 221. The unit 202 for the second bit from the top has one class-D power amplifier 212 and one capacitance 222. The unit 203 for the third bit from the top has one class-D power amplifier 213 and one capacitance 223. The unit 204 for the fourth bit from the top has one class-D power amplifier 214 and one capacitance 224.

The unit 205 for the second bit from the bottom has one class-D power amplifier 215 and four capacitors 225a to 225d. The unit 206 for the least significant bit (LSB), which is the lowest-order bit, has one class-D power amplifier 216 and four capacitors 226a to 226d.

Each of the class-D power amplifiers 211 to 216 is turned on or off in accordance with a binary-weighted AM code to thereby control the amplitude of a corresponding switched capacitor.

The class-D power amplifiers 211 to 214 for the higher four bits are constituted by the first switching elements 111a to 111o. All of the class-D power amplifiers 211 to 214 for the higher four bits have substantially the same size. The class-D power amplifiers 215 and 216 for the lower two bits are constituted by the second switching elements 112a to 112c. The class-D power amplifiers 215 and 216 for the lower two bits have substantially the same size.

Each of the number of first switching elements that constitute each of the class-D power amplifiers 211 to 214 for the higher bits and the number of second switching elements that constitute each of the class-D power amplifiers 215 and 216 for the lower bits is a power of 2.

More specifically, the class-D power amplifier 216 for the LSB, which is the lowest-order bit, is constituted by one of the second switching elements 112a to 112c. The class-D power amplifier 215 for the second bit from the bottom is constituted by two of the second switching elements 112a to 112c.

The class-D power amplifier 214 for the lowest-order bit of the higher bits is constituted by one of the first switching elements 111a to 111o. The class-D power amplifier 213 for the second bit from the bottom among the higher bits is constituted by two of the first switching elements 111a to 111o. The class-D power amplifier 212 for the third bit from the bottom among the higher bits is constituted by four of the first switching elements 111a to 111o. The class-D power amplifier 211 for the highest-order bit of the higher bits is constituted by eight of the first switching elements 111a to 111o.

Each of the second switching elements 112a to 112c drive the capacitors 225a to 225d, which has one-fourth of the size of the first switching elements 111a to 111o. Thus, the on-resistance of the second switching elements 112a to 112c is set to four times of the on-resistance of the first switching elements 111a to 111o. For example, the gate width or the number of fingers of the second switching elements 112a to 112c is set to one-fourth of the gate width or the number of fingers of the first switching elements 111a to 111o. The ratio of the number of second switching elements that constitute the class-D power amplifier 216 for the LSB to the number of second switching elements that constitute the class-D power amplifier 215 for the second bit from the bottom is 1 to 2.

The capacitors 221 to 224 for the higher four bits and the capacitors 225a to 225d and 226a to 226d for the lower two bits are constituted by the capacitance elements 113a to 113r.

The ratio of each of the capacitors 221 to 224 for the higher bits to each of the capacitors 225a to 226d for the lower bits is 4 to 1. In order to realize the capacitance ratio of 4 to 1, the capacitors 225a to 225d and the capacitors 226a to 226d for the lower bits are constituted by serially connecting four capacitors having the same size as that of the capacitors 221 to 224 for the higher bits. With this arrangement, even when variations occur in the capacitors 221 to 226d, changes in the capacitance ratio is small, since the amounts of changes due to the variations are constant among all of the capacitors 221 to 226d. Thus, it is possible to minimize performance deterioration due to variations in the capacitors 221 to 226d.

The switched-capacitor power amplification device has the binary configuration or has thermometer configurations for the corresponding higher bits and lower bits. In the thermometer configuration, for example, the ratio of the size of circuit elements for the higher bits and the size of circuit elements for the lower bits is set to, for example, 4 to 1. In such a case, the second switching elements 112a to 112c that constitute the class-D power amplifiers for the lower bits have a smaller size than the size of the first switching elements 111a to 111o that constitute the class-D power amplifiers for the higher bits in order to drive the capacitors having small capacitance values and in order to match the resistance values with those of the first switching elements 111a to 111o. In addition, the second switching elements 112a to 112c are arranged at positions further away from the output terminal 106 and the capacitor array 105 than the first switching elements 111a to 111o in order to match the parasitic resistances with those of connection lines with the capacitance elements 113a to 113r.

With this arrangement, since the sum of the on-resistances of the class-D power amplifiers and the parasitic resistances of the connection lines is accurately adjusted between the higher bits and the lower bits, it is possible to improve the overall linearity to provide favorable linearity. In particular, it is possible to reduce differential nonlinearity (DNL) error that occurs during switching between the higher bits and the lower bits.

It is desirable that the ratio of the sum of the on-resistances of the class-D power amplifiers and the parasitic resistances of the connection lines for the higher bits to the sum of the on-resistances of the class-D power amplifiers and the parasitic resistances of the connection lines for the lower bits have a relationship of an inverse of the ratio of the sum of the capacitances for the higher bits and the sum of the capacitances for the lower bits.

As described above, according to the present embodiment, adjustment is performed on not only the on-resistances of the output transistors of the first power amplification elements and the on-resistances of the output transistors of the second power amplification elements but also the parasitic resistances of the connection lines that provide connections between the first power amplification elements and the capacitors and the parasitic resistances of the connection lines that provide connections between the second power amplification elements and the capacitors, thus making it possible to improve the linearity to obtain favorable linearity.

(Second Embodiment)

The configuration of a transmitter according to a second embodiment of the present disclosure has substantially the same configuration as that illustrated in FIG. 1, except that a power amplification device 200 is provided instead of the power amplification device 82. Thus, a description of the same configuration is not given hereinafter.

<Configuration of Power Amplification Device>

The configuration of the power amplification device 200 according to the second embodiment of the present disclosure will now be described with reference to FIG. 4.

Figure 4:
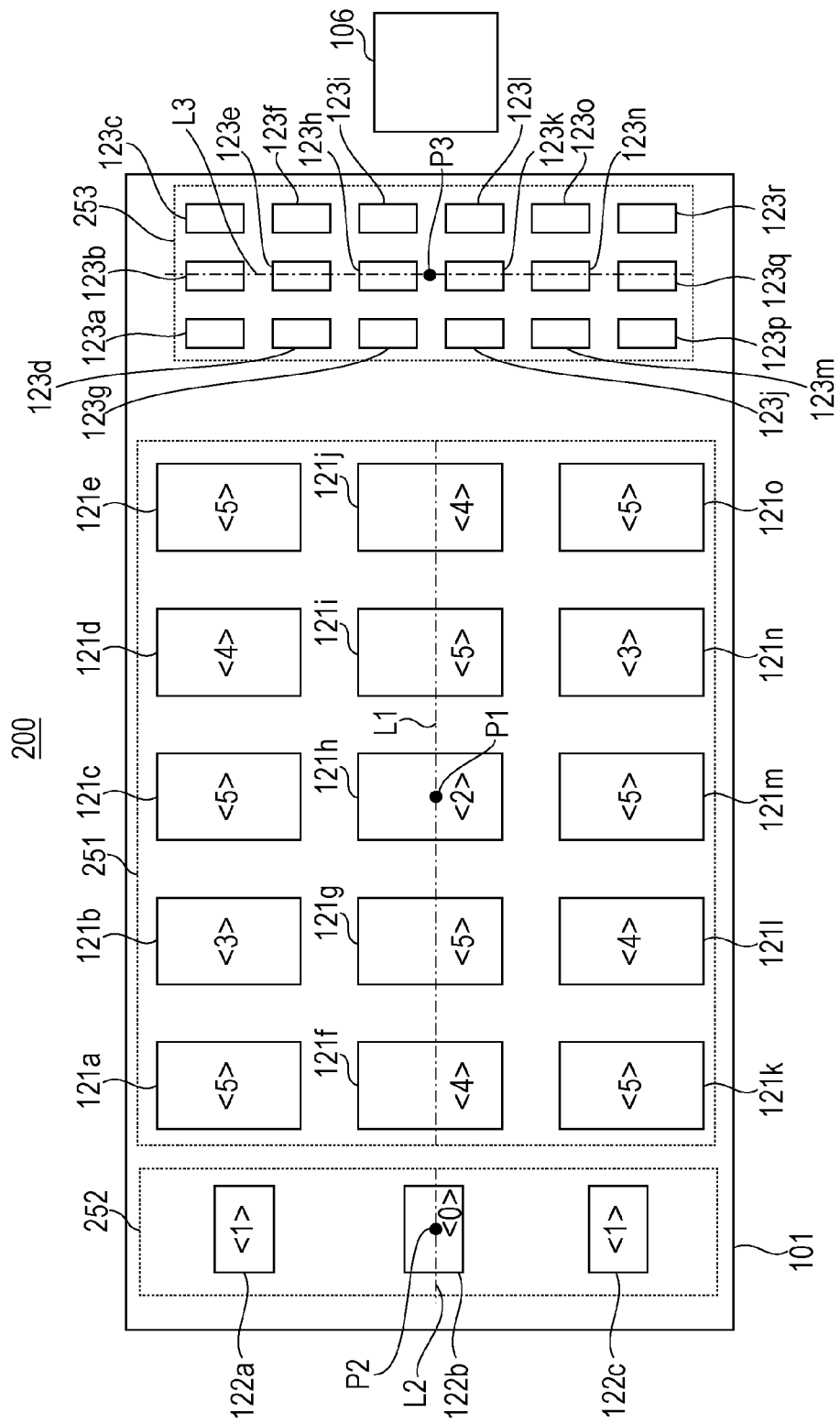
FIG. 4 is a plan view of a power amplification device according to a second embodiment of the present disclosure.

In FIG. 4, portions that are the same as or similar to those in FIG. 2 are denoted by the same reference numerals, and descriptions thereof are not given hereinafter. In FIG. 4, numerical values indicated in first switching elements 121a to 121o and second switching elements 122a to 122c represent the numbers of bits (i.e., the numerical values indicated subsequent to "AM CODE" in FIG. 3) of an AM code input to class-D power amplifiers that use the first switching elements 121a to 121o and the second switching elements 122a to 122c.

The power amplification device 200 generally includes a substrate 101, an output terminal 106, a first power-amplifier array 251, a second power-amplifier array 252, and a capacitor array 253.

The substrate 101 has the first power-amplifier array 251, the second power-amplifier array 252, and the capacitor array 253.

The first power-amplifier array 251 has the plurality of first switching elements 121a to 121o.

The second power-amplifier array 252 has the plurality of second switching elements 122a to 122c.

In the first power-amplifier array 251, the first switching elements 121a to 121o are arranged so as to have a so-called common-centroid arrangement.

More specifically, the first switching elements 121a, 121c, 121e, 121g, 121i, 121k, 121m, and 121o, which constitute the class-D power amplifier 211 for the highest-order bit among the higher bits, are arranged so as to be symmetric about a center point P1 of the arrangement of the first switching elements 211a to 211o.

The first switching elements 121d, 121f, 121j, and 121l, which constitute the class-D power amplifier 212 for the second bit from the top among the higher bits, are arranged so as to be symmetric about a center line L1 of the arrangement of the first switching element 211a to 211o.

The first switching elements 121b and 121n, which constitute the class-D power amplifier 213 for the third bit from the top among the higher bits, are arranged so as to be symmetric about the center line L1.

The first switching element 121h, which constitutes the class-D power amplifier 214 for the fourth bit from the top among the higher bits, are arranged so as to be symmetric about the center point P1 and be symmetric about the center line L1.

In the second power-amplifier array 252, the second switching elements 122a to 122c are arranged so as to have the so-called common-centroid arrangement.

More specifically, the second switching elements 122a and 122c, which constitute the class-D power amplifier 215 for the second bit from the bottom among the lower bits, are arranged so as to be symmetric about a center point P2 of the arrangement of the second switching elements 122a to 122c and be symmetric about a center line L2 of the arrangement of the second switching elements 122a to 122c.

The center point P1 and the center point P2 are different from each other. Since the second power-amplifier array 252 is arranged at a position further away from the capacitor array 253 than the first power-amplifier array 251, the center point P2 is further away from the capacitor array 253 than the center point P1. Herein, an arrangement having a plurality of center points P1 and P2 is referred to as "multi-centroid".

Since the configuration of the first power-amplifier array 251 and the configuration of the second power-amplifier array 252 other than those described above are substantially the same as the configurations in the first embodiment described above, descriptions thereof are not given hereinafter.

The capacitor array 253 has a plurality of capacitance elements 123a to 123r.

In the capacitor array 253, the capacitance elements 123a to 123r are arranged so as to have the so-called common-centroid arrangement.

More specifically, the capacitance elements 123a to 123r connected to the class-D power amplifiers 211 to 216 for the corresponding bits are arranged so as to be symmetric about a center point P3 of the arrangement of the capacitance elements 123a to 123r or be symmetric about a center line L3 of the arrangement of the capacitance elements 123a to 123r for the corresponding bits. Since the configuration of the capacitor array 253 other than those described above is substantially the same as the configuration in the first embodiment described above, a description thereof is not given hereinafter.

As described above, according to the present embodiment, since the first switching elements and the second switching elements are arranged in the multi-centroid, it is possible to suppress variations in the first switching elements and variations in the second switching elements, in addition to the advantages in the first embodiment described above. This makes it possible to provide a power amplification device having favorable linearity.

The above description has been given of a case in which, in the multi-centroid arrangement in the present embodiment, two centers (center points or center lines) of symmetry are set for a power amplification device having a two-stage configuration. However, a method in which the binary configuration in the power amplification device is more finely set with three or more channels (three or more stages) can be employed, and correspondingly, the number of centers (center points or center lines) of the symmetry may also be increased.

(Third Embodiment)

The configuration of a transmitter according to a third embodiment of the present disclosure is substantially the same as that in FIG. 1, except that a power amplification device 300 is provided instead of the power amplification device 82. Thus, a description of the same configuration is not given hereinafter.

<Configuration of Power Amplification Device>

The configuration of the power amplification device 300 according to the third embodiment of the present disclosure will now be described with reference to FIG. 5.

Figure 5:
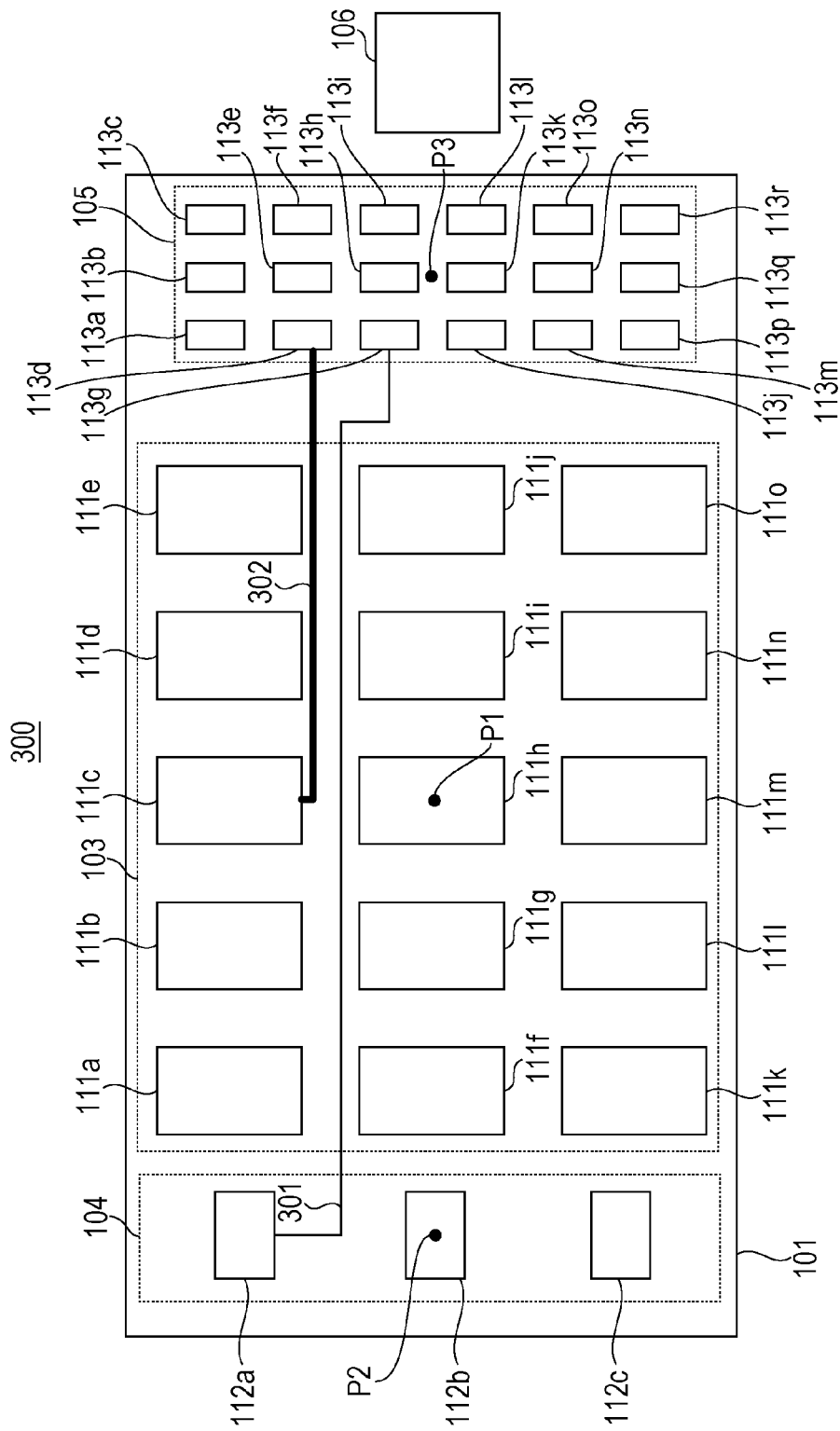
FIG. 5 is a plan view of a power amplification device according to a third embodiment of the present disclosure.

In FIG. 5, portions that are the same as or similar to those in FIG. 2 are denoted by the same reference numerals, and descriptions thereof are not given hereinafter.

First switching elements 111a to 111o are connected to corresponding capacitance elements of capacitance elements 113a to 113r through connection lines 302 on a one-to-one basis.

Second switching elements 112a to 112c are connected to the capacitance elements, included in the capacitance elements 113a to 113r and not connected to the first switching elements 111a to 111o, through connection lines 301 on a one-to-one basis.

Each connection line 301 has a larger overall length than that of each connection line 302 and has a smaller width than that of the connection line 302. Thus, the parasitic resistances of the connection lines 301 and 302 can be adjusted by the widths in addition to the distances.

Thus, the cross-sectional area of each connection line 301 is smaller than the cross-sectional area of each connection line 302. That is, the parasitic resistances of the connection lines 301 and 302 can be adjusted by the cross-sectional areas of the connection lines 301 and 302 in addition to the distances.

In order to improve the linearity of the power amplification device 300, it is preferable that the distance between the center point P2 of the arrangement of the second switching elements 112a to 112c and the center point P3 of the arrangement of the capacitor array 105 be set to about four times of the distance between the center point P1 of the arrangement of the first switching elements 111a to 111o and the center point P3 of the arrangement of the capacitor array 105. In this case, when an attempt is made to perform the adjustment by using the distances, the area of a semiconductor substrate increases, thus causing an increase in the manufacturing cost. However, adjusting the widths of the connection lines 301 and 302 in addition to the distances thereof makes it possible to provide a power amplification device having favorable linearity, without an increase in the area of the semiconductor substrate.

As described above, according to the present embodiment, adjusting the widths of the connection lines 301 and 302 makes it possible to obtain favorable linearity, without causing an increase in the manufacturing cost, in addition to the advantages in the first embodiment described above.

(Fourth Embodiment)

The configuration of a transmitter according to a fourth embodiment of the present disclosure is substantially the same as that in FIG. 1, except that a power amplification device 400 is provided instead of the power amplification device 82. Thus, a description of the same configuration is not given hereinafter.

<Configuration of Power Amplification Device>

The configuration of the power amplification device 400 according to the fourth embodiment of the present disclosure will now be described with reference to FIGS. 6 and 7.

Figure 6:
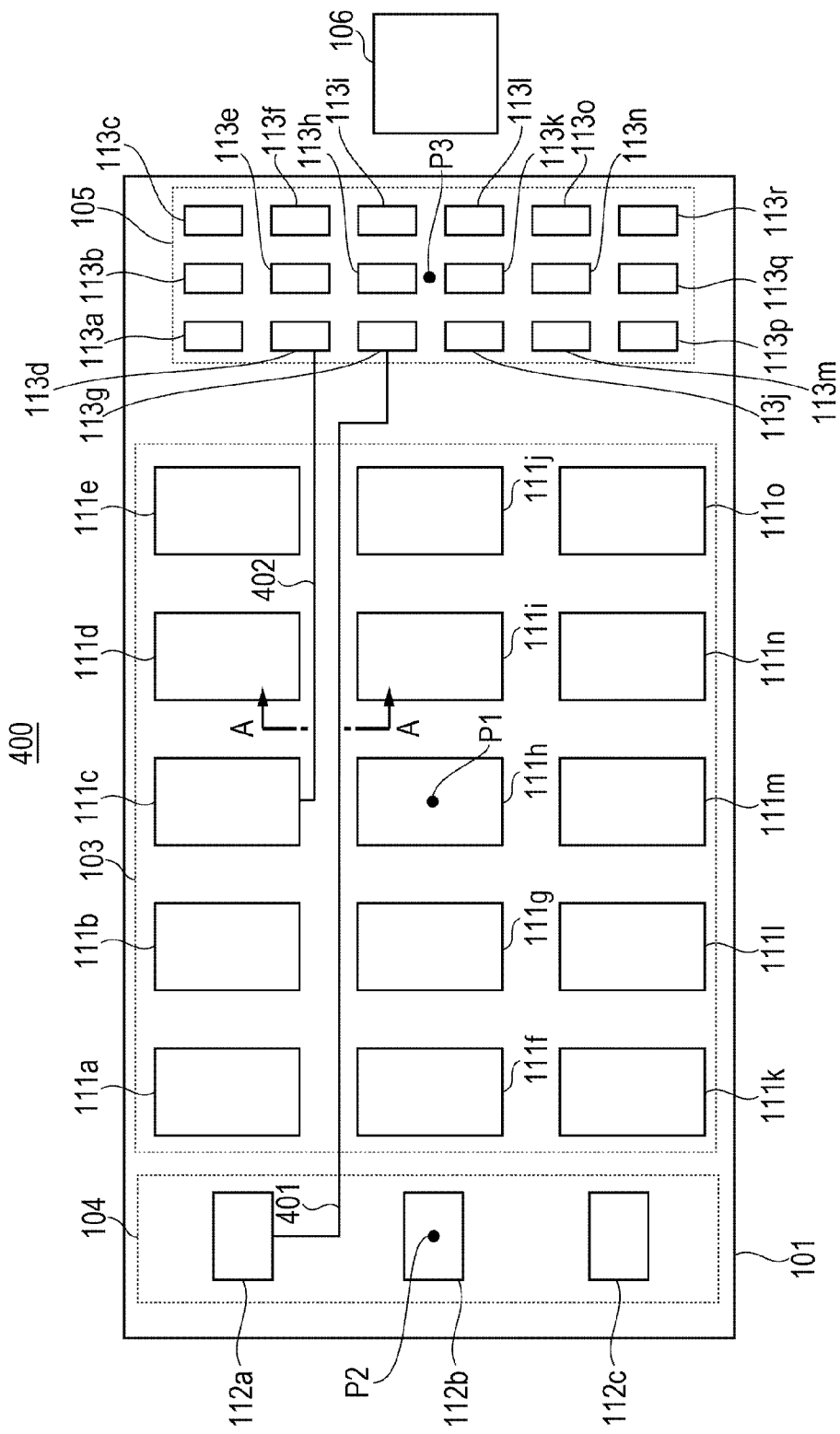
FIG. 6 is a plan view of a power amplification device according to a fourth embodiment of the present disclosure.
Figure 7:
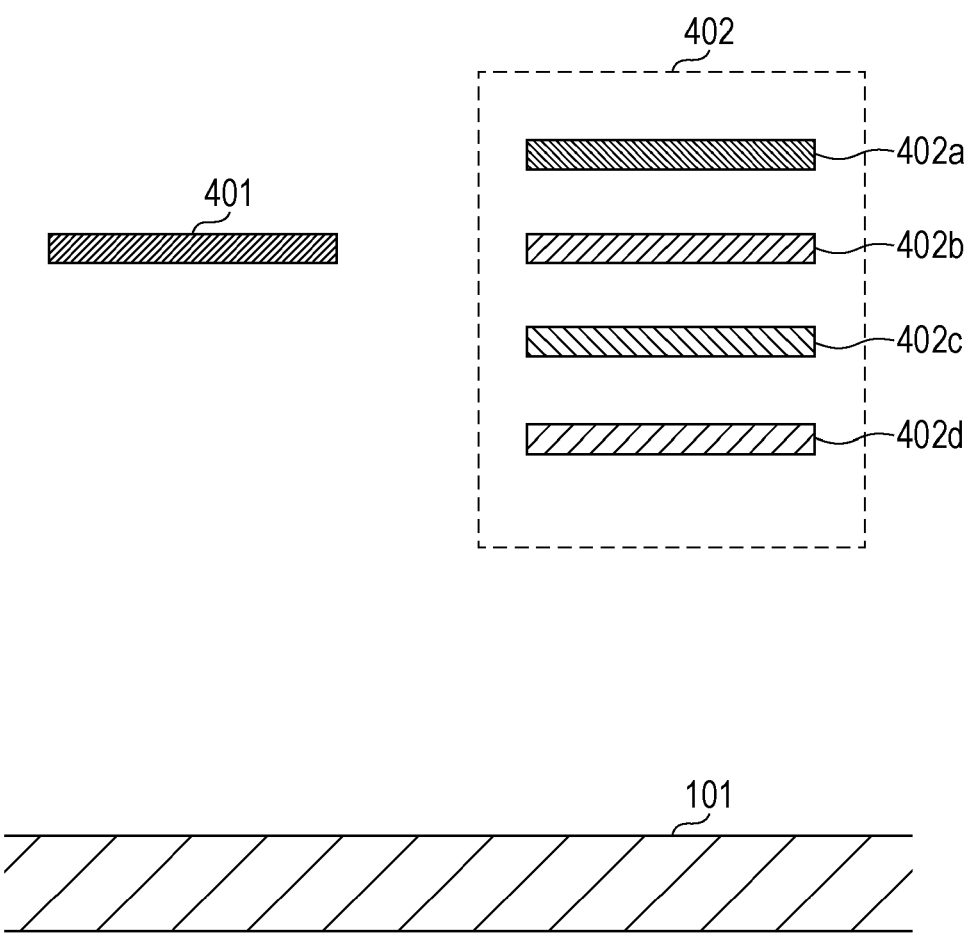
FIG. 7 is a cross-sectional view taken along line A-A in FIG. 6.

In FIGS. 6 and 7, portions that are the same as or similar to those in FIG. 2 are denoted by the same reference numerals, and descriptions thereof are not given hereinafter.

First switching elements 111a to 111o are connected to corresponding capacitance elements of capacitance elements 113a to 113r through connection lines 402 on a one-to-one basis.

Second switching elements 112a to 112c are connected to the capacitance elements, included in the capacitance elements 113a to 113r and not connected to the first switching elements 111a to 111o, through connection lines 401 on a one-to-one basis.

Next, the structures of the connection lines 401 and 402 will be described in more detail with reference to FIG. 7.

Each connection line 401 is formed in one of stacked wiring layers.

Each connection line 402 is formed in four of the stacked wiring layers. That is, the number of wiring layers in which the connection lines 402 are formed is larger than the number of wiring layers in which the connection lines 401 are formed. More specifically, each connection line 402 is constituted by a connection line 402d formed in a first wiring layer, which is a bottom layer, a connection line 402c formed in a second wiring layer, which is the second layer from the bottom, a connection line 402b formed in a third wiring layer, which is the third layer from the bottom, and a connection line 402a formed in a fourth wiring layer, which is the top layer. The connection lines 402a to 402d are insulated from each other by insulators (not illustrated).

With this arrangement, the parasitic resistances of the connection lines 401 and 402 can also be adjusted by using the number of wiring layers in addition to the distances.

Thus, the cross-sectional area of the connection line 401 is smaller than the cross-sectional area of the connection line 402. That is, the parasitic resistances of the connection lines 301 and 302 can be adjusted by using the cross-sectional areas of the connection lines 301 and 302 in addition to the distances.

In order to improve the linearity of the power amplification device 400, it is preferable that the distance between the center point P2 of the arrangement of the second switching elements 112a to 112c and the center point P3 of the arrangement of the capacitor array 105 be set to about four times of the distance between the center point P1 of the arrangement of the first switching elements 111a to 111o and the center point P3 of the arrangement of the capacitor array 105. In this case, when an attempt is made to perform the adjustment by using the distances, the area of the semiconductor substrate increases, thus causing an increase in the manufacturing cost. However, adjusting the number of layers for the connection lines 401 and the number of layers for the connection lines 402, in addition to the distances, makes it possible to provide a power amplification device having favorable linearity, without an increase in the area of the semiconductor substrate.

Thus, according to the present embodiment, adjusting the number of layers for the connection lines 401 and the number of layers for the connection lines 402 makes it possible to obtain favorable linearity, without causing an increase in the manufacturing cost, in addition to the advantages in the first embodiment.

In the present embodiment, although the number of wiring layers in which the connection lines 402 are formed is four times of the number of wiring layers in which the connection lines 401 are formed, it may be other than four times.

(Fifth Embodiment)

Since the configuration of a transmitter according to a fifth embodiment of the present disclosure is substantially the same as that in FIG. 1, a description thereof is not given hereinafter.

<Configuration of Power Amplification Device>

The configuration of a power amplification device according to the fifth embodiment of the present disclosure will now be described with reference to FIG. 8.

In FIG. 8, portions that are the same as or similar to those in FIG. 7 are denoted by the same reference numerals, and descriptions thereof are not given hereinafter.

Connection lines 501 are formed in one of stacked wiring layers. Each connection line 501 is formed in a wiring layer that is the same as the fourth wiring layer, which is the top layer in which a connection line 502a included in each connection line 502 is formed.

Each connection line 502 is formed in four of the stacked wiring layers. That is, the number of wiring layers in which the connection lines 502 are formed is larger than the number of wiring layers in which the connection lines 501 are formed. More specifically, each connection line 502 is constituted by a connection line 502d formed in a first wiring layer, which is a bottom layer, a connection line 502c formed in a second wiring layer, which is the second layer from the bottom, a connection line 502b formed in a third wiring layer, which is the third layer from the bottom, and a connection line 502a formed in a fourth wiring layer, which is a top layer. The connection lines 502a to 502d are insulated from each other by insulators (not illustrated).

The fourth wiring layer in which the connection lines 501 and the connection lines 502a are formed is the farthest wiring layer from the substrate 101.

A wire 503 can be formed with a thick and wide layer and is used as a power-supply line or a ground (GND) line that particularly requires a low-impedance characteristic.

Since the configuration of the power amplification device according to the present embodiment, except for the above-described configuration thereof, is substantially the same as the configuration in the first embodiment described above, a description thereof is not given hereinafter.

With this arrangement, as illustrated in FIG. 8, a parasitic capacitance C1 between each connection line 501 and the wire 503 and a parasitic capacitance C2 between each connection line 502a and the wire 503 can be made constant per unit area, and the parasitic capacitances of the connection lines 501 and 502 can also be adjusted with accuracy.

Thus, according to the present embodiment, adjusting the parasitic capacitances of the connection lines 501 and 502 makes it possible to obtain more favorable linearity, in addition to the advantages in the first embodiment described above.

In the present embodiment, combination with the adjustment of the widths of the connection lines described above in the third embodiment makes it possible to obtain more favorable linearity.

(Sixth Embodiment)

Figure 9:
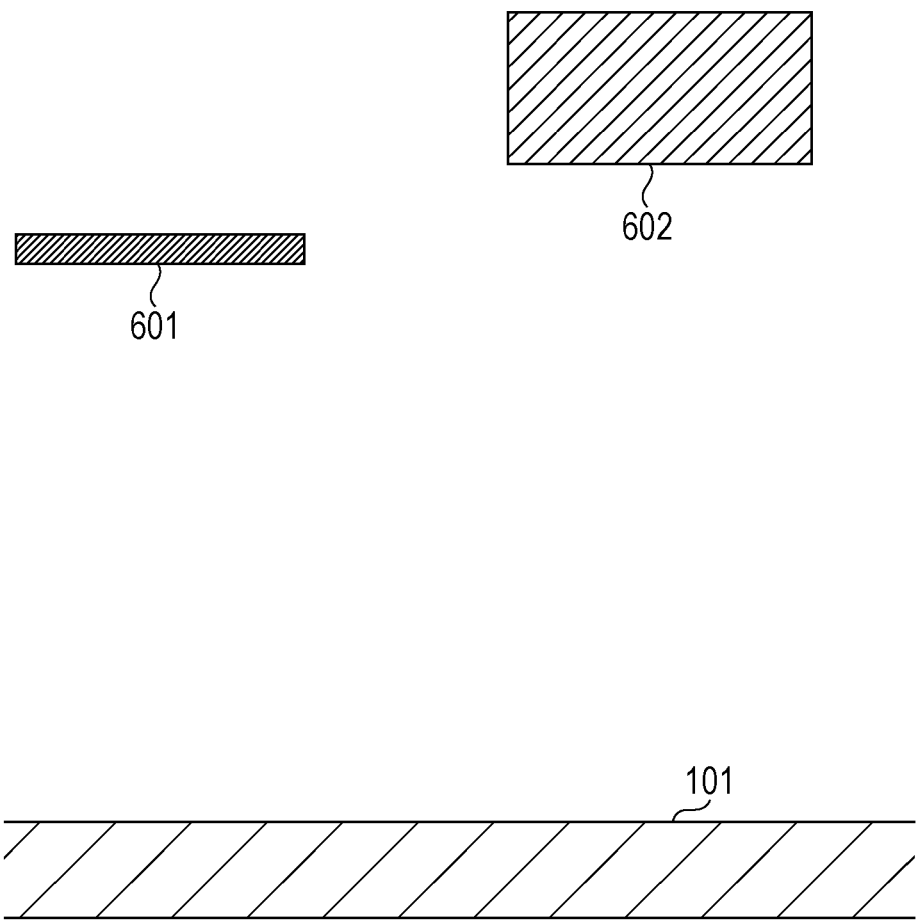
FIG. 9 is a cross-sectional view of a power amplification device according to a sixth embodiment of the present disclosure, the cross-sectional view corresponding to a view taken along line A-A in FIG. 6.

Since the configuration of a transmitter according to a sixth embodiment of the present disclosure is substantially the same as that illustrated in FIG. 1, a description thereof is not given hereinafter. The configuration of a power amplification device according to the sixth embodiment of the present disclosure will now be described with reference to FIG. 9. FIG. 9 is a cross-sectional view of the power amplification device according to the present embodiment, the cross-sectional view corresponding to a view taken along line A-A in FIG. 6. Connection lines 601 are formed in one of stacked wiring layers. The connection lines 601 are formed in a layer that is closer to the semiconductor substrate than connection lines 602 and that is thinner than a wiring layer in which the connection lines 602 are formed. The layer in which the connection lines 602 are formed is typically formed in a low-resistivity layer whose thickness and width can be increased. This layer is used as a power-supply line or a ground (GND) line that requires a low-impedance characteristic. Since the configuration of the power amplification device according to the present embodiment, except for the above-described configuration thereof, is substantially the same as the configuration in the first embodiment described above, a description thereof is not given hereinafter. With this arrangement, the wiring impedance of the connection lines 602 is smaller than the wiring impedance of the connection lines 601, as illustrated in FIG. 9. Thus, according to the present embodiment, in addition to the advantages in the first embodiment described above, it is possible to obtain favorable linearity without causing an increase in the manufacturing cost.

<Configuration of Power Amplification Device>

The configuration of a power amplification device 900 according to the sixth embodiment of the present disclosure will now be described with reference to FIG. 10.

Figure 10:
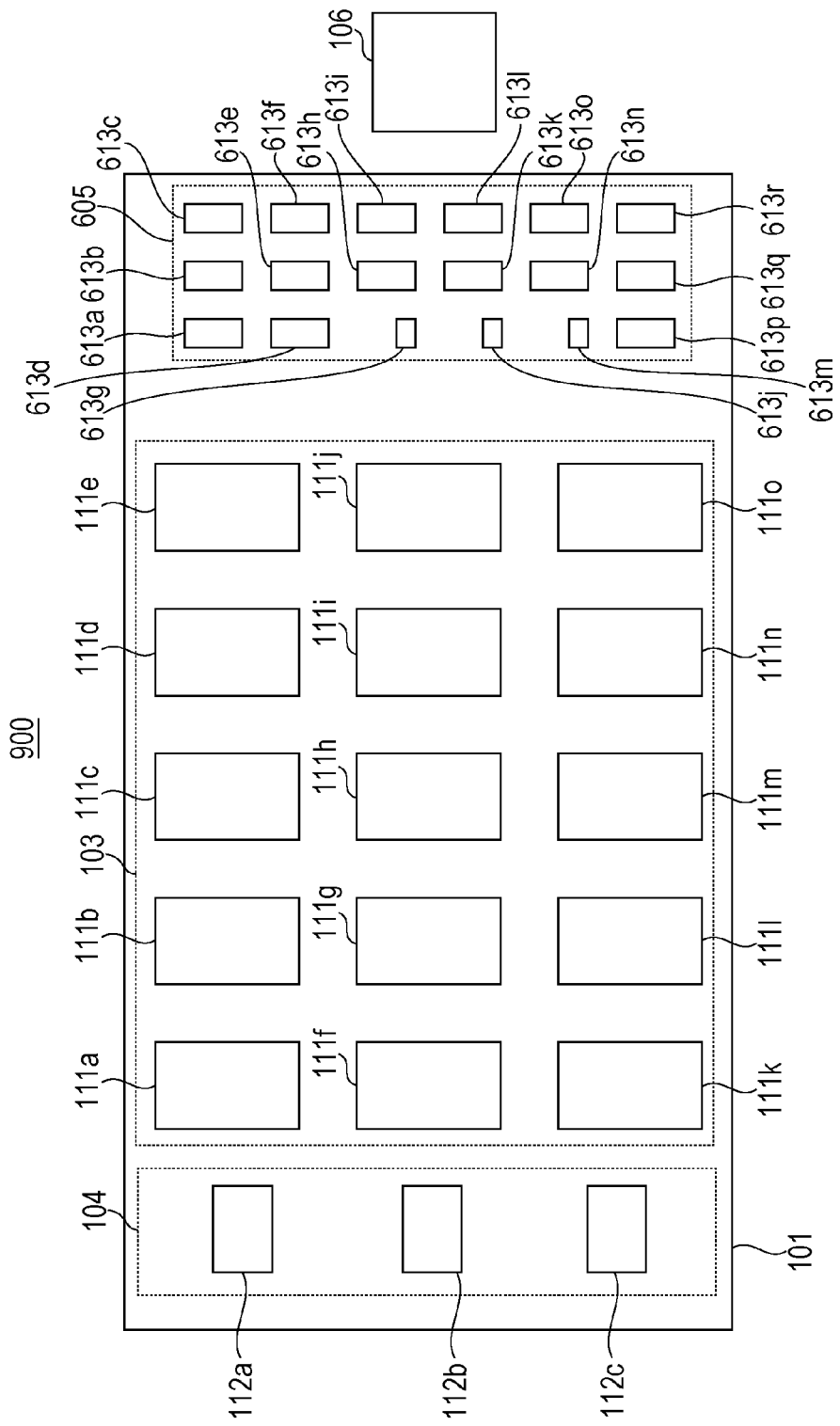
FIG. 10 is a plan view of the power amplification device according to the sixth embodiment of the present disclosure.

In FIG. 10, portions that are the same as or similar to those in FIG. 2 are denoted by the same reference numerals, and descriptions thereof are not given hereinafter.

A substrate 101 has a capacitor array 605.

The capacitor array 605 has a plurality of capacitance elements 613a to 613r. The capacitance elements 613a to 613r are connected to an output terminal 106. It is desirable that the capacitor array 605 be provided closer to the output terminal 106 within a possible range.

The capacitance elements 613a to 613r each have a rectangular shape in plan view and are arranged on the substrate 101 so as to have a quadrangular shape in plan view. More specifically, the capacitance elements 613a to 613r are arranged in an array of three columns and six rows. The capacitance elements 613a to 613r are, for example, MOM capacitors.

All of the capacitance elements 613a to 613f, 613h, 613i, 613k, 613l, and 613n to 613r have substantially the same size. The capacitance elements 613a to 613f, 613h, 613i, 613k, 613l, and 613n to 613r are connected to the first switching elements 111a to 111o on a one-to-one basis and are driven when the first switching elements 111a to 111o are turned on.

All of the capacitance elements 613g, 613j, and 613m have substantially the same size and have a mounting area on the substrate 101 which is slightly larger than one-fourth of the mounting area of the capacitance elements 613a to 613f, 613h, 613i, 613k, 613l, and 613n to 613r. For example, the number of fingers is adjusted so that the capacitance elements 613g, 613j, and 613m have that mounting area. The capacitance elements 613g, 613j, and 613m are connected to second switching elements 112a, 112b, and 112c on a one-to-one basis and are driven when the corresponding second switching elements 112a to 112c are turned on.

In the capacitor array 605, the capacitance elements 613g, 613j, and 613m are arranged at positions away from the output terminal 106, compared with the other capacitance elements. With this arrangement, the wiring resistances of wires that provide connections between the output terminal 106 and the capacitance elements 613g, 613j, and 613m can be set higher than the wiring resistances of wires that provide connections between the output terminal 106 and the other capacitance elements 613a to 613f, 613h, 613i, 613k, 163l, and 163n to 613r, thus making it possible to improve the linearity. Each of the capacitance elements 613g, 613j, and 613m is connected to one of the second switching elements 112a, 112b, and 112c. When the capacitance elements 613g, 613j, and 613m in FIG. 10 are used, unit 205 for the second lowest-order bit in the switched capacitor power amplification device having a binary configuration of FIG. 3 can be replaced by the class-D power amplifier 215 and one capacitor, and unit 206 for the lowest-order bit (LSB) in FIG. 3 can be replaced by the class-D power amplifier 216 and one capacitor.

For example, when MOM capacitors having a minute capacitance value, for example, 100 fF or less, is used, an influence of the parasitic capacitances cannot be ignored. In this case, a capacitance when four capacitors are connected in series is one-fourth of the capacitance of a single capacitor having the same size. However, the parasitic capacitance that is ideally desired to decrease with the capacitance increases, since the number of connections is increased. Consequently, the linearity decreases.

In contrast, in the present embodiment, since the capacitance elements (613g, 613j, and 613m) that constitute four capacitors connected in series have a slightly larger mounting area than one-fourth of that of the capacitance elements (613a to 613f, 613h, 613i, 613k, 613l, and 613n to 613r) that constitute one capacitor, and thus have a smaller capacitance, compared with a case in which they have the same size as that of the capacitance elements 613a to 613f, 613h, 613i, 613k, 613l, and 613n to 613r. Hence, the power amplification device 900 can suppress a parasitic-capacitance increase caused by an increase in the number of capacitors that are connections.

As described above, according to the present embodiment, the mounting area of the capacitance elements that constitute capacitors connected in series are made slightly larger than one-fourth of the mounting area of the capacitance elements that constitute one capacitor. This make it possible to control fringing capacitances, which are parasitic capacitances when MOM capacitors are used, and also makes it possible to prevent a reduction in linearity when MOM capacitors are used, in addition to the advantages in the first embodiment described above.

The capacitance elements 613g, 613j, and 613m do not necessarily have to have a mounting area that is slightly larger than one-fourth of the mounting area of the capacitance elements 613a to 613f, 613h, 613i, 613k, 613l, and 613n to 613r and may have a mounting area that is smaller than the mounting area of the capacitance elements 613a to 613f, 613h, 613i, 613k, 613l, and 613n to 613r and that is larger than one-fourth of the amount area thereof.

(Seventh Embodiment)

Since the configuration of a transmitter according to a seventh embodiment of the present disclosure is substantially the same as that in FIG. 1, a description thereof is not given hereinafter.

<Configuration of Power Amplification Device>

The configuration of a power amplification device according to the seventh embodiment of the present disclosure will now be described with reference to FIG. 11.

Figure 11:
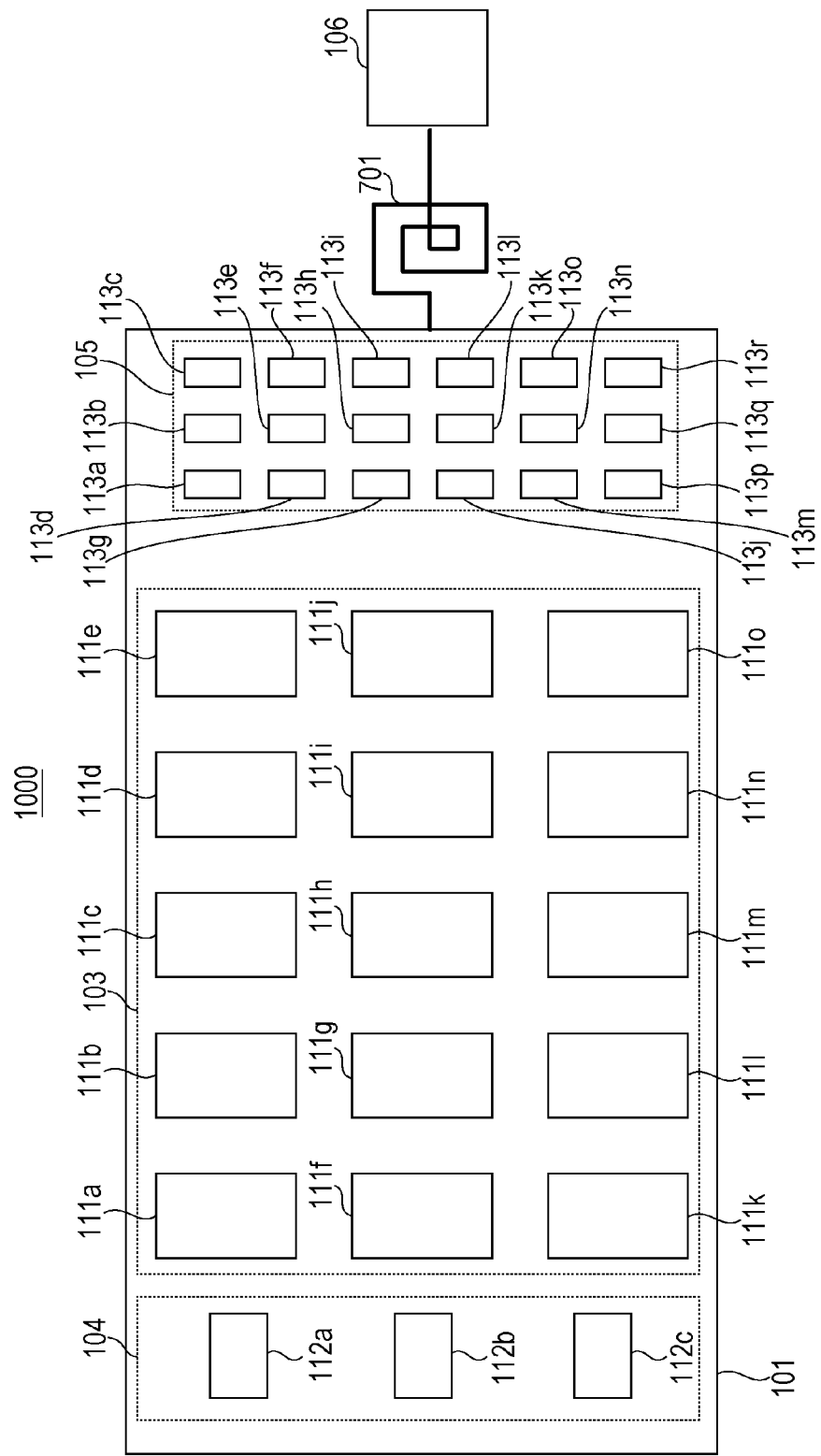
FIG. 11 is a plan view of a power amplification device according to a seventh embodiment of the present disclosure.

In FIG. 11, portions that are the same as or similar to those in FIG. 2 are denoted by the same reference numerals, and descriptions thereof are not given hereinafter.

A power amplification device 1000 generally includes a substrate 101, a first power-amplifier array 103, a second power-amplifier array 104, a capacitor array 105, an output terminal 106, and an inductor 701.

One terminal of the inductor 701 is connected to the output terminal 106, and another terminal of the inductor 701 is connected to capacitance elements 113a to 113r. It is desirable that the inductor value of the inductor 701 and the addition value of all capacitances of the capacitance elements 113a to 113r be set so as to resonate at the frequency of carrier wave signals. Since such an arrangement makes it possible to eliminate the need to provide the inductor 701 externally, it is possible to reduce the manufacturing cost of the transmitter.

The output terminal 106 provides a connection between the inductor 701 and the antenna 83 (see FIG. 1).

As described above, according to the present embodiment, it is possible to efficiently amplify carrier wave signals, in addition to the advantages in the first embodiment described above.

(Eighth Embodiment)

<Configuration of Transmitter>

The configuration of a transmitter 2 according to an eighth embodiment of the present disclosure will be described below in detail with reference to FIG. 12.

In FIG. 12, portions that are the same as or similar to those in FIG. 1 are denoted by the same reference numerals, and descriptions thereof are not given hereinafter.

The transmitter 2 generally includes a baseband unit 80, an oscillator 81, a power amplification device 82, a filter 1100, and an antenna 83.

In accordance with AM codes input from the baseband unit 80, the power amplification device 82 operates to amplify the levels of carrier wave signals input from the oscillator 81 and outputs the resulting carrier wave signals to the filter 1100.

The filter 1100 is provided between the power amplification device 82 and the antenna 83. The filter 1100 is, for example, a band-pass filter formed by combination of surface acoustic wave filters, stack filters, or surface-mount devices. The filter 1100 reduces unwanted spectra outside the band of signals input from the power amplification device 82 and outputs, to the antenna 83, resulting signals in which unwanted spectra are reduced.

The antenna 83 uses a wireless channel to transmit signals input from the filter 1100.

Thus, according to the present embodiment, it is possible to provide a transmitter that can transmit signals in which unwanted spectra are reduced, in addition to the advantage in the first embodiment described above.

In the embodiments described above, the description has been given of a case in which the power amplification device employs a two-stage configuration for the lower two bits and the higher four bits. However, in the embodiments described above, the power amplification device is not limited to such a two-stage configuration and may have an n-stage configuration (n is a positive integer greater than or equal to 2). For example, the power amplification device may employ a three-stage configuration for the lower two bits, the middle-order four bits, and the higher four bits. Even when the power amplification device has a configuration with three or more stages, it is preferable that the switching elements for the lower bits be arranged at positions that are further away from the capacitor array, as in the above-described embodiments.

The power amplification device and the transmitter according to the present disclosure are preferably applied to wireless communication to amplify the level of transmission signals.

What is claimed is:
1. A power amplification device comprising:
a first power-amplifier array including a plurality of first switching elements that constitute a plurality of class-D power amplifiers for a plurality of most significant bits respectively;
a second power-amplifier array including a plurality of second switching elements that constitute a plurality of class-D power amplifiers for a plurality of least significant bits respectively, the plurality of second switching elements having a larger on-resistance than the plurality of first switching elements; and
a capacitor array including a plurality of capacitors that include a plurality of first capacitors that are connected to the plurality of first switching elements respectively and are driven when the plurality of first switching elements are turned on and a plurality of second capacitors that are connected to the plurality of second switching elements respectively and are driven when the plurality of second switching elements are turned on, wherein the first power-amplifier array is arranged between the second power-amplifier array and the capacitor array.

2. The power amplification device according to claim 1, wherein the plurality of first switching elements are arranged on a substrate, the arrangement of the plurality of first switching elements is symmetric about a center point of the arrangement of the plurality of first switching elements or symmetric about a center line of the arrangement of the plurality of first switching elements, and the second switching elements are arranged on the substrate, the arrangement of the plurality of second switching elements is symmetric about a center point of the arrangement of the plurality of second switching elements or symmetric about a center line of the arrangement of the plurality of second switching elements.

3. The power amplification device according to claim 1, wherein the plurality of capacitors are arranged on a substrate, the arrangement of the plurality of capacitors is symmetric about a center point of the arrangement of the plurality of capacitors or symmetric about a center line of the arrangement of the plurality of capacitors.

4. The power amplification device according to claim 1, further comprising:

first connection lines that connect the plurality of first switching elements with the plurality of first capacitors; and second connection lines that connect the plurality of second switching elements with the plurality of second capacitors, each of the second connection lines having a smaller cross-sectional area than a cross-sectional area of each of the first connection lines.

5. The power amplification device according to claim 4, wherein each of the second connection lines has a smaller width than a width of each of the first connection lines.

6. The power amplification device according to claim 4, wherein the first connection lines are formed on a first number of wiring layers among a plurality of stacked wiring layers; and the second connection lines are formed on a second number of wiring layer(s), the second number being smaller than the first number.

7. The power amplification device according to claim 6, wherein the second connection lines and the first connection lines are formed in a wiring layer that is closest to a power-supply line or a ground line.

8. The power amplification device according to claim 1, further comprising:

a semiconductor substrate on which the capacitor array, the first power-amplifier array, and the second power-amplifier array are arranged.

9. The power amplification device according to claim 8, wherein the first connection lines are formed on a first wiring layer among a plurality of stacked wiring layers, and the second connection lines are formed on a second wiring layer among the plurality of wiring layers, the second wiring layer having a smaller layer thickness than the first wiring layer.

10. The power amplification device according to claim 1, wherein each of the plurality of capacitors is a metal-oxide-metal (MOM) capacitor; and each of the second capacitors has a mounting area that is smaller than a mounting area of each of the first capacitors and that is larger than one-fourth of the mounting area of each of the first capacitors.

11. The power amplification device according to claim 1, further comprising:

an output terminal that outputs a transmission signal that is amplified by using the first power-amplifier array and the second power-amplifier array; and an inductor provided between the capacitance array and the output terminal.

12. A transmitter comprising:

the power amplification device according to claim 1; and an antenna that transmits a transmission signal amplified by the power amplification device.

\* \* \* \* \*